United States Patent [19]

Becker

[11] 4,412,138

[45] Oct. 25, 1983

[54] PULSE GENERATOR CIRCUIT

[75] Inventor: Josef Becker, Marbach, Fed. Rep. of Germany

[73] Assignee: Hewlett-Packard GmbH, Boblingen, Fed. Rep. of Germany

[21] Appl. No.: 335,307

[22] Filed: Dec. 28, 1981

[51] Int. Cl.³ .................. H03K 3/295; H03K 5/24; H03K 5/02

[52] U.S. Cl. .................. 307/264; 307/257; 307/321; 307/491; 328/171

[58] Field of Search .............. 307/264, 257, 321, 494, 307/491

[56] References Cited

U.S. PATENT DOCUMENTS 3,986,049 10/1976 Campbell et al. .................. 328/171
3,999,084 12/1976 Beaudette .......................... 307/264
4,218,662 8/1980 Schroder ............................ 307/264

Primary Examiner—John S. Heyman
Attorney, Agent, or Firm—Joseph H. Smith

[57] ABSTRACT

A pulse generator circuit generates pulses or logic signals with variable upper and lower levels. According to a preferred embodiment of this invention there are provided two variable voltage sources representing variable logic state levels. For alternately connecting these voltage sources with the output of the circuit there is provided a diode bridge in the configuration of a Graetz rectifier with two nodes connected to these voltages sources and the other two nodes forming complementary output signals; these latter two nodes are also connected to equal and opposite constant current sources which are reversible in accordance with a control signal. The voltage sources are coupled to the bridge via operational amplifiers configured as voltage followers. In each associated feedback loop of the voltage sources there is a diode substantially identical to those of the bridge which is coupled to a constant current source equal in magnitude to those of the constant current sources connected to the bridge. The directions of the diodes in the feedback loops are chosen so that the voltage drops in the feedback loops compensate for the voltage drops in the diode bridge, thereby providing complementary output signals which are a true representation of the magnitude of the voltage sources.

3 Claims, 2 Drawing Figures

PULSE GENERATOR CIRCUIT

BACKGROUND OF THE INVENTION

In many applications of pulse generators, data generators, test instruments for digital circuits, etc., a manual or program-controlled adjustment of voltage levels of two logic states or pulse amplitudes is required.

In the prior art, the voltage levels have typically been controlled by a current distribution control circuit (see e.g., Hewlett-Packard Model 8160A Operating and Service Manual, page 8-152 and following). For this purpose, suitable analog multipliers have been used. The accuracy of the pulse amplitude adjustment with this type of circuit is dependent on the electrical symmetry of the semiconductor current switches over the range of the characteristics actually used. Also, the current divider branches must be symmetrical with respect to each other. In these prior art circuits, it has been difficult to keep the error below 1%, even if integrated circuits are used. Additionally, there is a tendency to overshoot and spurious peaks are coupled into the output signal.

It is also known to vary the current sum of a differential amplifier for generating the variable logic state levels according to the other control input of an analog multiplier circuit (see e.g., Hewlett-Packard Model 8160A Operating and Service Manual, page 4-57). A circuit operating according to this method is advantageous in that the current sum determining the amplitude can be precisely controlled. However, there are still problems with spurious peaks and overshoot.

Still another known circuit uses two variable voltage sources which are adjusted to the low and high logic state levels and are alternately connected to the output via an electronic switch, e.g., a field effect transistor (see B. E. Sear, "Computer Design," May 1972). A circuit of this type is advantageous in that it does not need a linear post-amplifier for providing the required output power of the pulse or data signal. In this case, the accuracy is limited by the bulk resistance of the electronic switches. In order to minimize this bulk resistance, field effect switching transistors having large area structures must be employed. Such switching transistors, however, cause coupling of non-negligible spurious peaks from the driving signal into the output signal via the transistors' internal capacitances.

In circuits for providing variable pulse rise times between given fixed logic state levels, it is known to employ a clamping circuit having diodes as switches. This circuit reasonably suppresses spurious peaks in the output signal, and overshoot in the output signal is also fully suppressed. However, if this principle is employed in a circuit for generating pulses with variable logic state levels, pulsating currents result in the two logic state level voltage sources. This can cause amplitude errors in the driving amplifiers for the two signal levels, particularly in the critical frequency ranges of the amplifiers.

SUMMARY OF THE INVENTION

A circuit according to a preferred embodiment of the invention provides pulses with variable logic state levels of high accuracy. The generated pulses are relatively free of spurious peaks and overshoot.

According to a preferred embodiment of this invention there are provided two variable voltage sources representing the variable logic state levels. For alternately connecting these voltage sources with the output of the circuit there is provided a diode bridge in the configuration of a Graetz rectifier, with a first pair of diodes having their cathode leads connected at a first node to the output of a first voltage source, and a second pair of diodes having their anode leads connected at a second node to the output of a second voltage source. One anode lead of the first pair of diodes and one cathode lead of the second pair of diodes are then connected to a third node which is connected to a first constant current source. The second anode lead of the first pair of diodes and the second cathode lead of the second pair of diodes are then connected to a fourth node which is connected to a second constant current source, the second constant current source being equal in magnitude to the first constant current source but oppositely directed. The direction of these constant current sources may be changed in accordance with a corresponding control signal. The voltage sources are coupled to the first and second nodes via operational amplifiers configured as voltage followers. In each feedback loop associated with these operational amplifiers there is a diode substantially identical to the diodes of the bridge circuit. These diodes in the feedback circuits are fed with currents equal to that of the first and second constant current sources and are coupled in such a direction that the influence of the voltage drops within the diode bridge on the output levels is compensated by the voltage drops in the feedback loops.

A circuit according to a preferred embodiment of the invention provides logic state levels with voltage errors below 1% for each frequency within a frequency range from DC to about 100 MHz, a significantly higher operation frequency than can be achieved with prior art circuits. The circuit generates pulses with extremely steep and linear edges. Relatively large voltage differences, e.g., more than 10 V, may be obtained between the logic state levels. Thus, if a power post-amplifier is used at all, it need not have a large voltage gain. Furthermore, the power consumption of the circuit according to the invention is also relatively low.

Moreover, since the circuit generates principally two complementary output signals, another embodiment of the invention is available. If only one of the output signals is required, the other may be used for increasing the edge steepness of the output pulses via differentiating circuits.

A circuit according to a preferred embodiment of the invention is particularly suitable as a data or address driving circuit in test equipment for electronic components or integrated circuits.

DESCRIPTION OF THE PREFERRED EMBODIMENT

Figure 1:
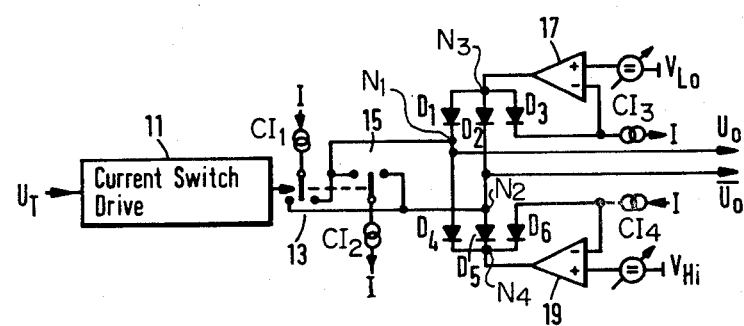
FIG. 1 is a schematic of a circuit according to a preferred embodiment of the invention for generating pulses or logic signals.

In FIG. 1 reference numeral 11 indicates a current switch driving arrangement which simultaneously actuates two current switches 13 and 15. Current switch driving arrangement 11 is controlled by an input signal $U_T$ which may be a simple clock signal or a binary data signal. Via current switches 13 and 15, two equal but oppositely directed constant currents, I, can be alternately connected to nodes $N_1$ and $N_2$, these constant currents being provided by constant current sources CI1 and CI2. Nodes $N_1$ and $N_2$ also form two nodes of a diode bridge in Graetz recitifier configuration, the bridge being made up of diodes $D_1$, $D_2$, $D_4$, and $D_5$. The output terminals of the circuit which deliver complementary output signals $U_o$ and $\overline{U}_o$ and are also connected to these nodes.

Two other nodes, nodes $N_3$ and $N_4$, are connected to the outputs of operational amplifiers 17 and 19, respectively. Operational amplifiers 17 and 19 are connected as voltage followers. The positive inputs of operational amplifiers 17 and 19 are connected to variable voltage sources $V_{LO}$ and and $V_{Hi}$, respectively, corresponding to the desired logic state levels of the output signal $U_o$. The inverting inputs of operational amplifiers 17 and 19 are connected to feedback networks made up of diodes $D_3$ and $D_6$, respectively. Diodes $D_3$ and $D_6$ are connected in the same sense as diodes $D_1$ and $D_2$ on the one hand and $D_4$ and $D_5$ on the other hand, respectively. Each of diodes $D_3$ and $D_6$ is subject to a constant current, I, in its respective conducting direction from either current source CI3 or CI4. These constant currents are are identical in magnitude to those from current sources $CI_1$ and $CI_2$.

If all diodes $D_1$ through $D_6$ have the same properties, the diode junction voltage drops within the diode bridge are equal to the voltage drops in the respective feedback loops of operational amplifiers 17 and 19, and thus, the logic state levels of the output signal $U_o$, and the complementary output signal $\overline{U}_o$ exactly correspond to the voltage levels of voltage sources $V_{LO}$ and $V_{Hi}$, respectively. This compensation effect is independent of the ambient temperature since the temperature dependent bulk resistances of all diodes vary synchronously and uniformly in response to temperature variations.

As a result of the synchronous actuation of current switches 13 and 15, either diodes $D_1$ and $D_5$ or diodes $D_2$ and $D_4$ are conducting. Thus, operational amplifiers 17 and 19 are allowed to source or sink constant currents.

If current switches 13 and 15 are in their left position as illustrated in FIG. 1, the output signal $\overline{U}_o$ has the logic state level $V_{LO}$ (and the complementary output signal $U_o$ has the logic state level $V_{Hi}$). In the right position of current switches 13 and 15 the logic state levels are reversed.

Figure 2:
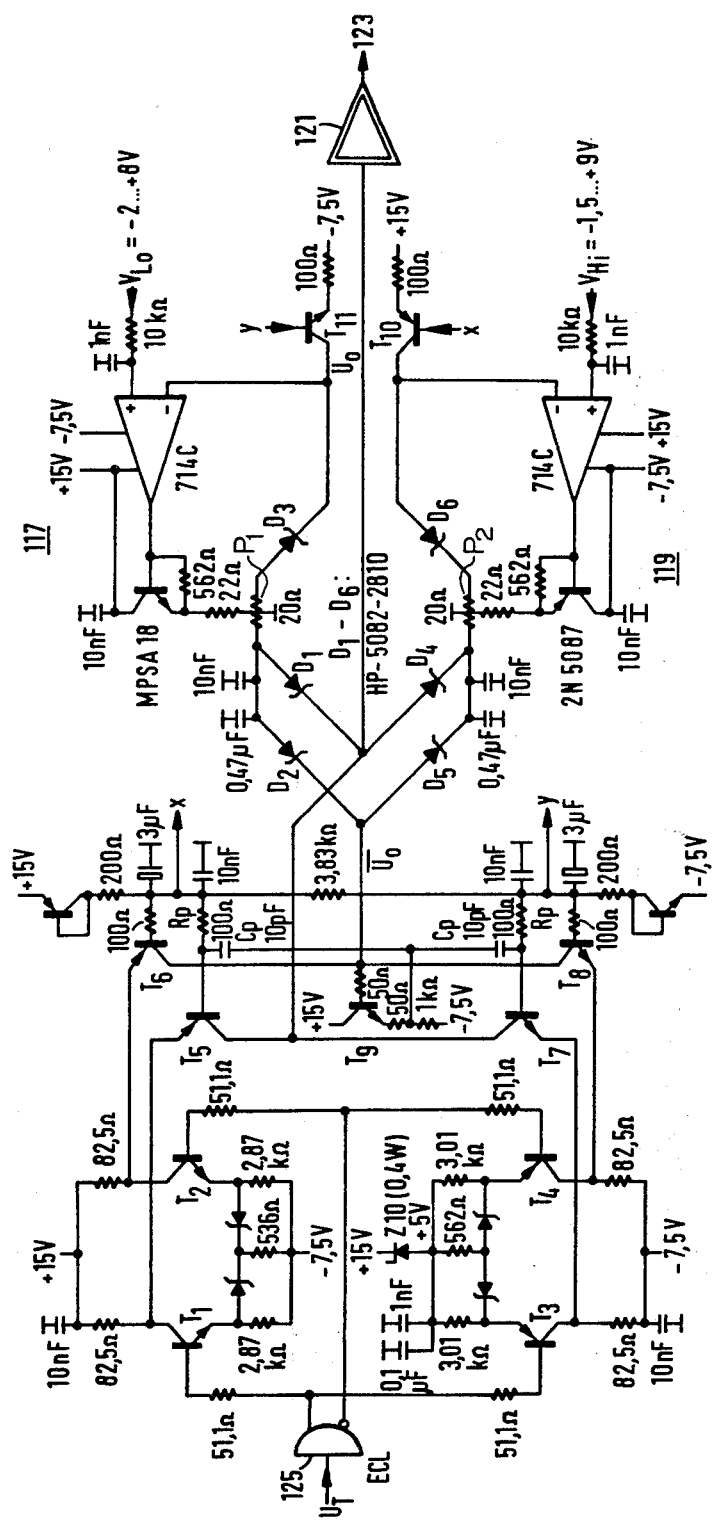
FIG. 2 is a detailed circuit diagram of a preferred embodiment of a circuit operating according to the principle of FIG. 1.

FIG. 2 shows a detailed circuit diagram of a preferred embodiment of the invention. As in the circuit diagram of FIG. 1, there are six diodes $D_1$ through $D_6$. Schottky diodes are employed in order to assure quick switching. Operational amplifier circuits 117 and 119 correspond to operational amplifiers 17 and 19, respectively in FIG. 1. Operational amplifier circuits 117 and 119 each comprise one high-precision operational amplifier (such as Fairchild μA 714 HC).

The output signal $U_o$ is coupled to an output terminal 123 via a current amplifier or impedance converter 121. The current amplifier or impedance converter 121 is only schematically shown in FIG. 2. Suitable circuits are well known to those skilled in the art.

As in the circuit of FIG. 1, the circuit in FIG. 2 is driven by a drive signal $U_T$ (clock or binary signal) in ECL-format. The driving signal $U_T$ is split into two complementary signals by means of an input gate 125. These signals are the input signals of a complementary push-pull cascode circuit comprising transistors $T_1$ through $T_8$. Transistors $T_5$ through $T_8$ correspond to current switches 13 and 15 in FIG. 1. The supply voltage levels of the circuit are $+15$ V and $-7.5$ V. Arrows x and y in the center part of FIG. 2 are connected to respective arrows with the same identification in the right part of FIG. 2. Thus, transistors $T_{10}$ and $T_{11}$ can deliver the same fixed currents for diodes $D_6$ and $D_3$, respectively, as do the aforementioned current switches for the other diodes. Hence, in this alternative embodiment there are four separate current sources just as in FIG. 1.

In order to speed up the switching of current switch transistors $T_5$ and $T_7$ and thus to increase the steepness of the edges of the generated pulses, differentiating circuits are provided comprising resistors $R_p$ and capacitors $C_p$. The complementary output signal $\overline{U}_o$ is supplied to these differentiating circuits via an emitter follower $T_9$.

Values and types of the components employed in the embodiment according to FIG. 2 are explicitly designated in FIG. 2. Also shown are potentiometers $P_1$ and $P_2$ for assuring proper balance in the system. With the circuit shown, an output pulse rise time of 2.5 V/ns can be achieved. The logic state levels are adjustable between $-2$ and $+8$ V ($V_{LO}$) and $-1.5$ and $+9$ V ($V_{Hi}$).

I claim:
1. A pulse generator circuit for generating pulses with variable upper and lower levels, comprising:
   an input for receiving a driving signal;
   an output having two complementary terminals where said pulses or logic signals are delivered in response to the driving signal;
   first and second variable voltage sources, said first voltage source representing said upper level and said second voltage source representing said lower level;
   switching means for alternately connecting the output with one of said voltage sources, said switching means comprising a diode bridge in Graetz rectifier configuration having a first pair of diodes with the cathode leads of said first pair of diodes coupled at a first node, having a second pair of diodes with the anode leads of said second pair of diodes coupled at a second node, having one anode lead of said first pair of diodes coupled to one cathode lead of said second pair of diodes to form a third node corresponding to one terminal of said output, and having the other anode lead of said first pair of diodes coupled to the other cathode lead of said second pair of diodes to form a fourth node corresponding to the other terminal of said output;
   first current source means coupled to said input for supplying a constant current to said third node and for supplying an equal but oppositely directed constant current to said fourth node, the directions of said constant currents from said first current source means to said third and fourth nodes being reversible in response to said driving signal;
   said first voltage source comprising a first amplifier with a feedback circuit in voltage follower configuration, said feedback circuit comprising a fifth diode oriented with its cathode lead coupled to said first node and to the output of said first amplifier, said fifth diode having substantially the same characteristics as said diodes comprising said diode bridge;

said second voltage source comprising an amplifier with a feedback circuit in voltage follower configuration, said feedback circuit comprising a sixth diode oriented with its anode lead coupled to said second node and to the output of said second amplifier, said sixth diode and having substantially the same characteristics as said diodes comprising said diode bridge;

second current source means coupled to said fifth diode for supplying a constant current therethrough which is equal in magnitude to said current supplied by said first current source means so that voltage drops in said diode bridge are compensated; and third current source means coupled to said sixth diode for supplying a constant current therethrough which is equal in magnitude to said current supplied by said first current source means so that voltage drops in said diode bridge are compensated.

2. A pulse generator circuit as in claim 1, wherein said first current source means comprises two two-transistor current switches in complementary cascode configuration.

3. A pulse generator circuit as in claim 1 or 2 wherein one of said two complementary output terminals is coupled via differentiating circuits to said first current source means for decreasing the switching time required to reverse the directions of said constant currents from said first current source means.

* * * * *

Dedication

4,412,138.—*Josef Becker,* Marbach, Fed. Rep. of Germany. PULSE GENERATOR CIRCUIT. Patent dated Oct. 25, 1983. Dedication filed May 24, 1984, by the assignee, *Hewlett-Packard GmbH.*

Hereby dedicates the entire remaining term of said patent to the Public.
*[Official Gazette July 10, 1984.]*